US006617665B2

(12) United States Patent
Farcy et al.

(10) Patent No.: US 6,617,665 B2
(45) Date of Patent: Sep. 9, 2003

(54) HIGH-FREQUENCY INTEGRATED INDUCTIVE WINDING

(75) Inventors: Alexis Farcy, La Ravoire (FR); Vincent Arnal, Grenoble (FR); Joaquim Torres, Saint Martin le Vinoux (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/125,162

(22) Filed: Apr. 18, 2002

(65) Prior Publication Data

US 2003/0092202 A1 May 15, 2003

(30) Foreign Application Priority Data

Apr. 20, 2001 (FR) .............................................. 01 05403

(51) Int. Cl.⁷ ............................................. H01L 27/108
(52) U.S. Cl. ....................................................... 257/531
(58) Field of Search ........................... 438/238; 257/531

(56) References Cited

U.S. PATENT DOCUMENTS 4,442,590 A    4/1984  Stockton et al.
5,639,686 A  *  6/1997  Hirano et al. ............... 438/381

FOREIGN PATENT DOCUMENTS

EP           1 079 458 A2   2/2001

* cited by examiner

Primary Examiner—Jey Tsai
(74) Attorney, Agent, or Firm—Wolf, Greenfield & Sacks, P.C.; James H. Morris; William R. McClellan

(57) ABSTRACT

An inductance formed in an integrated circuit chip, formed of a plurality of parallel conductive lines, of optimized width, each conductive line being formed in the thickness of at least one insulating layer, these lines being interconnected by at least one perpendicular conductive segment.

18 Claims, 2 Drawing Sheets

HIGH-FREQUENCY INTEGRATED INDUCTIVE WINDING

BACKGROUND OF THE INVENTION

1. Field of the Invention

The present invention generally relates to the forming of inductive windings (inductances) on an integrated circuit chip. More specifically, the present invention relates to the forming of inductances intended to receive high-frequency currents, such as, for example, high-frequency antennas of mobile phones or filters.

2. Discussion of the Related Art

FIGS. 1A to 1D illustrate, in a simplified partial cross-section view, the forming of an inductance according to a conventionally-implemented step sequence. More specifically, FIGS. 1A to 1D are cross-section views along the width of an inductance spiral.

As illustrated in FIG. 1A, a trench is first opened in an insulating layer 10 according to the inductance pattern. A layer of a conductive material 11 is then deposited to completely fill the previously-opened trench.

At the next steps, illustrated in FIG. 1B, layer 11 is etched to be removed from the upper surface of insulating layer 10. For this purpose, a chem-mech polishing (CMP) is performed. A first horizontal conductive level 12 has thus been formed. As discussed previously, FIG. 1 is a cross-section view along the width of a spiral of the inductance. First level 12 extends over the entire inductance pattern, and is common to all its spirals. Then, an insulating layer 13 is deposited. Layer 13 is deposited so that its upper surface is substantially planar.

As illustrated in FIG. 1C, distinct openings are formed in layer 13 to partially expose different portions of the upper surface of first level 12. Then, these openings are filled with a conductive material 14, preferably identical to conductive material 11 forming first level 12.

After deposition over the entire structure of material 14, a chem-mech polishing is performed to remove material 14 from the upper surface of insulating layer 13.

Parallel conductive vias 16 in contact with first level 12 are thus individualized, as illustrated in FIG. 1D. Then, an insulating layer 17 is deposited so that its upper surface is substantially planar. A second horizontal conductive level 18 is then formed above first level 12 and interconnects all vias 16. Second level 18 is formed by opening a trench according to an appropriate pattern in insulating layer 17, then by depositing a conductive material, preferably identical to conductive material 11, and finally performing a chem-mech polishing (CMP) to only maintain in place the copper in the previously-formed trench.

An inductance with spirals including first and second horizontal conductive levels 12 and 18 interconnected by vias 16 is thus formed. Interconnection lines or vias may be formed in insulating layers 10, 13, and/or 17 simultaneously with first level 12, with vias 16 and/or with second level 18.

In applications of telecommunication type, inductances are conversely deposited above integrated circuits, no other conductive element being formed in insulating layers 10, 13, and 17. Such inductances, intended to be used as antennas in high-frequency devices, must exhibit a maximum quality factor Q and be able to operate at an optimal resonance frequency and/or in the widest possible frequency band.

Increasing factor Q leads to reducing the resistance of the inductance. For this purpose, it has already been provided to use as a conductive material forming levels 12 and 18 and vias 16 lightly resistive materials such as copper or copper-based alloys. To further reduce the resistivity, it has then been provided to increase the surface area of levels 12 and 18 and of vias 16. This increase being impossible in the thickness of successive layers 10, 13, 17 determined by other standard constraints of microelectronics methods, the widest possible levels 12 and 18 have been formed in layers 10 and 17, correspondingly increasing the number of vias 16 in layer 13. However, such a width increase of levels 12 and 18 is limited by the chem-mech polishing implemented to individualize the spirals in each layer. Indeed, in a CMP of a relatively wide copper surface, a power consumption of this surface, that is, the forming of a hole with a poorly defined depth and extent, can be observed. The real resistance of the line conducting a given current is then increased and quality factor Q is decreased. This decrease in quality factor Q is uncontrolled. Further, if the surface area is too large, this deformation may occur to the extent of tearing up the conductive line. This results in a spiral breakage.

Another disadvantage of a widening of levels 12 and 18 is the negative impact on the resulting electric performances. Indeed, when the inductance so formed conducts a given current, said current generates a magnetic field which itself gives rise to an inverse current, called an eddy current. This inverse current corresponds to an increase in the real resistance. Now, this eddy current is proportional to the spiral width, and not to its thickness or its length. Increasing the spiral width thus results in increasing the real resistance and correspondingly decreasing quality factor Q.

Further, when a high-frequency electric current is attempted to be directed through a conductor, the current tends to only flow at the periphery of the conductive volume (skin effect). In other words, for high-frequency currents, instead of taking advantage of the entire conductive surface, the current limits to a small peripheral surface. The current being of relatively high frequency, everything occurs as if the current would flow in a conductor of high real resistance. The quality factor is further lowered. Accordingly, the frequency range, that is, the maximum frequency which can be reached by a current flowing through such an inductance, is limited.

Currently, given the various previously-discussed problems, inductances stand currents having a frequency of at most 50 Hz.

At the same time, the desire to transmit a higher and higher number of data, and the frequency range congestion leads to searching communication systems adapted to operating at the highest possible frequencies with optimized quality factors.

SUMMARY OF THE INVENTION

The present invention accordingly aims at providing an inductance formed in an integrated circuit chip, having a perfectly controlled quality factor.

The present invention aims at providing such an inductance having a relatively high frequency band.

The present invention also aims at providing such an inductance, the manufacturing of which inscribes in the step sequence currently implemented in the manufacturing of the metallizations of an integrated circuit.

To achieve these and other objects, the present invention provides an inductance formed in an integrated circuit chip, formed of a plurality of parallel conductive lines, of optimized width, each conductive line being formed in the thickness of at least one insulating layer, these lines being interconnected by at least one perpendicular conductive segment.

According to an embodiment of the present invention, the optimized width is equal to twice the skin thickness corresponding to the maximum frequency of a high-frequency current running through said inductance.

According to an embodiment of the present invention, the conductive lines are formed in three insulating layers and the conductive segments are formed in at least one of the three insulating layers.

The present invention also includes a method for forming an inductance in monolithic form, including the step of forming in at least one insulating layer, along the inductance pattern, a plurality of parallel conductive lines and segments perpendicular to said lines and intercepting all of them.

According to an embodiment of the present invention, the conductive lines have a width equal to twice the skin thickness corresponding to the maximum frequency of a high-frequency current intended to be conducted by the inductance.

According to an embodiment of the present invention, any step of forming and/or extension of conductive lines in an insulating layer includes the steps of digging, into the considered insulating layer, trenches according to the desired pattern; depositing a layer of a conductive material to fill the trenches; and performing a chem-mech polishing, to remove said conductive material from the upper surface of said considered insulating layer, whereby the conductive material only remains in place in the previously-formed trenches.

According to an embodiment of the present invention, the conductive material is a metal, for example copper or a copper-based alloy.

The foregoing objects, features and advantages of the present invention, will be discussed in detail in the following non-limiting description of specific embodiments in connection with the accompanying drawings.

DETAILED DESCRIPTION

For clarity, the same elements have been designated with the same references in the different drawings. Further, as usual in the representation of integrated circuits, the various drawings are not to scale.

Figure 2A:
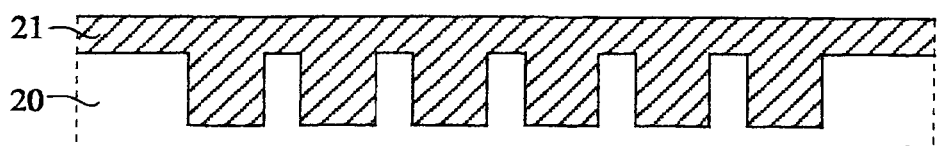
FIGS. 2A to 2C illustrate, in partial simplified cross-section views, steps of the forming of an inductance according to the present invention.
Figure 2B:
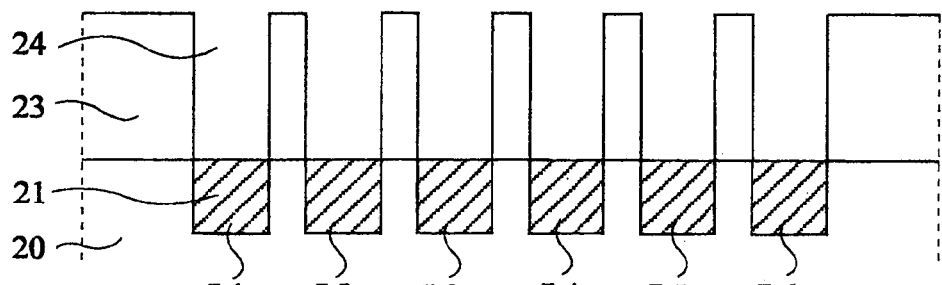
Figure 2C:
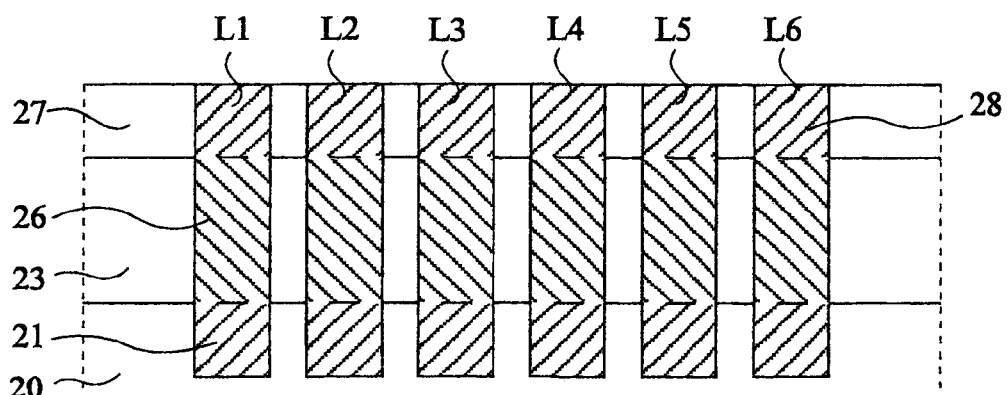

FIGS. 2A, 2B, and 2C illustrate, in partial simplified cross-section views, the cross-section of a spiral of an inductance according to the present invention being manufactured.

The forming of an inductance according to the present invention starts, as illustrated in FIG. 2A, with the opening, in an insulating layer 20, of several parallel trenches, for example six, according to the inductance pattern. Insulating layer 20 is superposed to a semiconductor substrate (not shown) in and on which are integrated various elements. The sum of the individual widths of these trenches is equal to the width desired for an inductance spiral. The individual width of each trench is optimized as detailed hereafter.

Figure 1A:
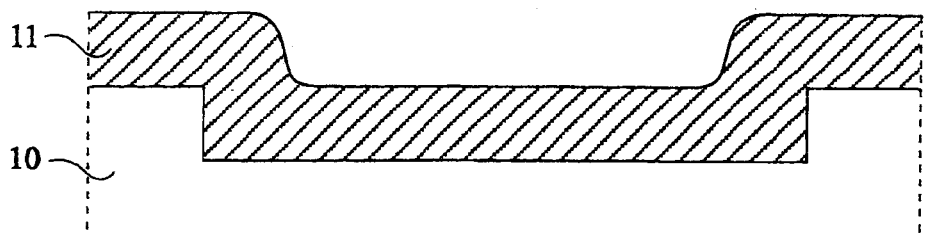
FIGS. 1A to 1D illustrate, in partial simplified cross-section views, different manufacturing steps of an inductance according to conventional methods.
Figure 1B:
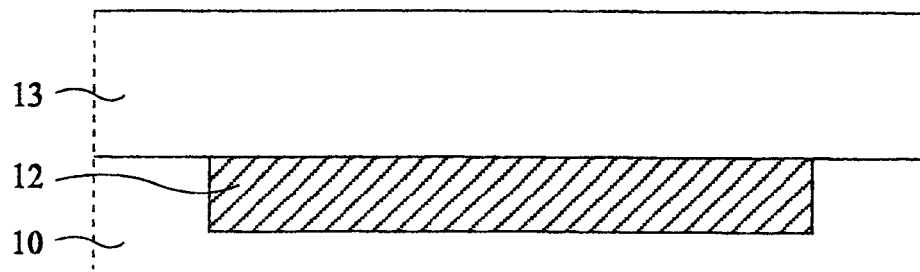
Figure 1C:
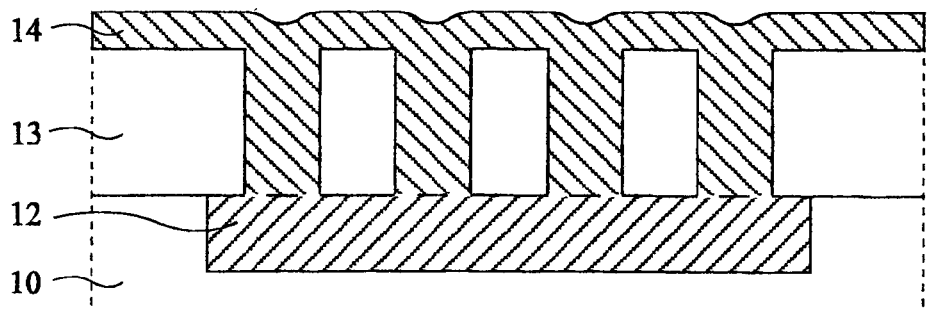
Figure 1D:
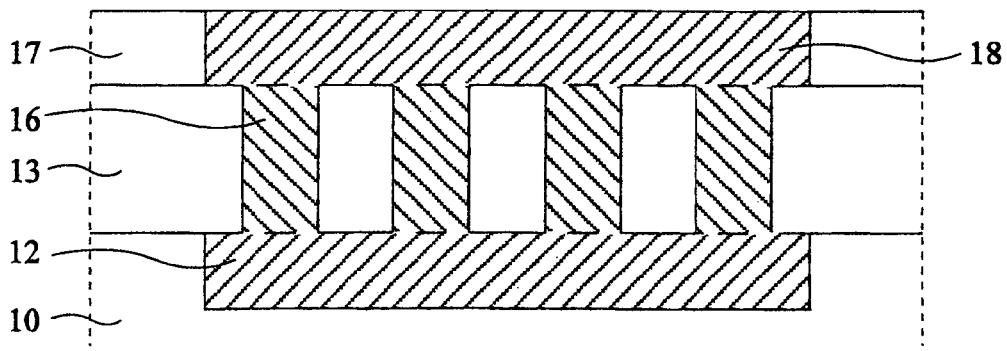

The trenches thus formed are then filled by depositing over the entire structure a conductive material 21, preferably a metal, for example copper. As compared to a conventional method, the thickness of layer 21 is much smaller than the thickness of the homologous layer (11, FIG. 1A). Indeed, the filling of a series of parallel trenches of optimized width is much faster than the filling of a single wide opening, for a same total base surface area. The filling of the parallel trenches then occurs while a smaller copper thickness 21 has been deposited on layer 20.

Material 21 is then removed from the upper surface of insulator 20 by chem-mech polishing. This removal is performed more easily than that of the homologous layer of prior art. Indeed, on the one hand, the thickness of layer 21 is smaller and, on the other hand, the risks of sinking or tearing of material 21 in the trenches are limited by their small surface area and the alternation of material 21 and of the portions of insulator 20 separating two consecutive trenches.

Figure 3:
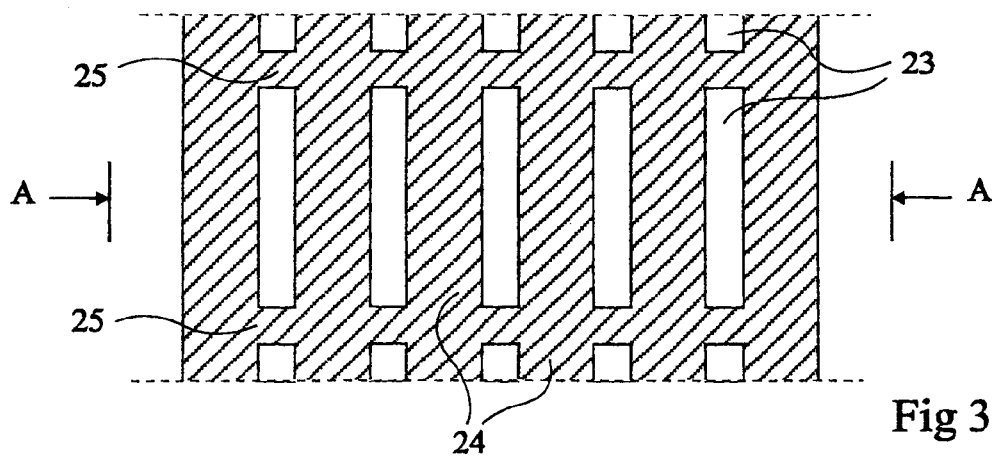
FIG. 3 illustrates, in an enlarged top view, a portion of an inductance according to the present invention.

Six distinct parallel conductive trenches L1, L2, L3, L4, L5, and L6 are then formed as illustrated in FIG. 2B. At the next steps, an insulating layer 23 is deposited so that its upper surface is planar. Insulating layer 23 is then dug into according to the trench pattern described hereafter in relation with FIG. 3. A first series of trenches 24 enables exposing the upper surface of each of the six previously-formed conductive lines L1 to L6. These trenches 24, as illustrated FIGS. 2B and 3, are separate and parallel. Perpendicularly to these first trenches 24, second trenches 25 which intercept all the first trenches 24 are formed. Trenches 25 thus extend over the entire width of the spiral. The width of the trenches 25 is minimized. FIG. 2B corresponds to a cross-section along axis A—A of FIG. 3, parallel to and distinct from trenches 25.

As illustrated in FIG. 2C, a conductive material 26 is then deposited, to fill the first trenches 24 and the second perpendicular trenches 25. This is done by depositing material 26 over the entire structure, then implementing a CMP to remove material 26 outside of trenches 24 and 25. The six lines L1 to L6 have thus been extended in layer 23. Further, an electric interconnection between these different lines has been formed by filling the second trenches 25. Finally, all the previously-described steps are repeated to further extend conductive lines L1 to L6 in an insulating layer 27 by depositing a conductive material 28.

A spiral of an inductance formed of a plurality of parallel lines, for example, six lines L1, L2, L3, L4, L5, and L6, has thus been formed. Lines L1 to L6 extend over the entire inductance length. The width of lines L1, L2, L3, L4, L5, and L6 is optimized in the considered technology for a given frequency according to the following constraints. On the one hand, lines L1 to L6 must be as wide as possible to reduce or minimize their static resistance. On the other hand, lines L1 to L6 must be as reduced as necessary to reduce the resistance increase at high frequencies. For a given maximum operating frequency, the trench width should then be at most equal to twice the corresponding skin thickness. The width is preferably equal to this limiting value, to minimize the static resistance. However, if the maximum possible frequency is too high, the width will be made as close to this limit as enabled by the methods of trench formation in an insulating layer 20, 23, 22 and the methods of deposition of a lightly resistive conductive material 22, 26, 28.

The different separate lines L1 to L6 are interconnected by conductive segments perpendicular to these lines, formed at least in intermediary layer 23 by the filling of trenches 25.

The object of these perpendicular segments is to form a single spiral from lines L1 to L6. These perpendicular segments or bridges also enable ensuring a homogeneity of the potentials in the different lines L1 to L6 to avoid a capacitive coupling.

Further, to reduce the density of material 26 before CMP, as few perpendicular segments or bridges as necessary will be provided to ensure an equipartition of the current flowing through lines L1 to L6.

According to an alternative, not shown, the bridges are formed not only in intermediary layer 23, but also in one and/or the other of lower and upper layers 20 and 27.

According to an alternative, no shown, the bridges are not formed in intermediary layer 23, but only in one and/or the other of lower and upper layers 20 and 27.

Further, conductive lines L1 to L6 formed in three conductive levels have been described as a non-limiting example. Said lines may be formed in more or less than three levels. However, in at least one of these levels will the bridges intercepting them all be formed.

According to an embodiment, the lightly-resistive conductive materials forming layers 22, 26, 28 are identical. Preferably, a metal such as copper or a copper-based alloy will be chosen.

Such a method has many advantages. First, the individualizing of various lines L1 to L6 by CMP is eased with respect to a conventional method. Each copper portion has a reduced width, be it lines L1 to L6 and/or the bridges, and is embedded in an insulator.

The corresponding copper density lowering eliminates, or at least strongly decreases, risks of sinking and/or tearing.

Another advantage of this method is that it is now possible to widen the spiral as much as desired. Indeed, this spiral widening translates as an increase in the number of parallel lines interconnected by bridges. This can be performed without risking to damage the lines and/or the bridges in their individualization by CMP.

Another advantage of such a structure is that the eddy currents proportional to the width of the spirals are considerably reduced as compared to eddy currents present in existing structures. Indeed, the first and second horizontal conductive levels (12, 18, FIG. 1) of large width have been eliminated.

This advantageously enables increasing the amount of the currents flowing through the spiral. Indeed, the corresponding induced magnetic field increase cause smaller eddy currents than those which would be induced in a standard structure.

Similarly, the structure according to the present invention has the advantage of enabling increasing the frequency of the currents flowing through the spiral. This effect will be optimized by forming lines L1 to L6 having a width smaller than twice the skin thickness. The maximum possible frequency is then limited by the sole constraints of the trench forming method in an insulating layer 20, 23, 22 and of the methods of deposition of a lightly-resistive conductive material 22, 26, 28.

Thus, assuming that the different insulating layers 20, 23, and 27 have a thickness ranging between 1 and 10 µm, for example, on the order of 4 µm, it is currently possible to reduce the trench thickness to a size ranging between 0.2 and 5 µm, for example, on the order of 1 µm. Then, each lines L1 to L6 is totally run through by a current as long as its frequency is smaller than 20 GHz. The skin effect only appears beyond this. Then, the resistance is constant, independent from the frequency over a much wider frequency range than in standard devices such as previously described in relation with FIG. 1. This range may extend to approximately 100 GHz without affecting the quality of the transmitted information.

Of course, the present invention is likely to have various alterations, modifications, and improvements which will readily occur to those skilled in the art. In particular, when numerical examples have been given, these numerical example do not aim at limiting the present invention to such examples. Especially, the width of the various trenches will be reduced to the optimum value desirable according to the methods of trench forming in an insulating layer and of filling of such trenches with a lightly resistive material. Similarly, the number of conductive lines will be increased, if necessary, to enable as high currents as possible to flow.

Further, those skilled in the art will know how to form, if necessary, in each of the various insulating layers 20, 23, 27 outside of the inductance-forming region, any other element necessary to the device operation. They will also be able to provide elements adapted to avoiding any capacitive coupling between the inductance and other elements formed in the same integrated circuit chip.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An inductance formed in an integrated circuit chip, formed of a plurality of parallel conductive lines of optimized width and having a length, each conductive line being formed in a thickness of at least one insulating layer, these lines being interconnected only by a plurality of perpendicular conductive segments, the segments being separated from one another in the direction of the length, each of the plurality of conductive lines extending over the entire length of the inductance and each conductive segment extending over the entire width of the inductance.

2. The inductance of claim 1, wherein the optimized width is equal to twice a skin thickness corresponding to a maximum frequency of a high-frequency current running through said inductance.

3. The inductance of claim 1, wherein the conductive lines are formed in three insulating layers and the conductive segments are formed in at least one of the three insulating layers.

4. An inductive element for conducting current in a first direction, comprising:

a plurality of conductive lines each having a length extending in the first direction and having a height perpendicular to the first direction, the plurality of conductive lines formed in an insulating material such that each of the plurality of conductive lines is separated from another of the plurality of conductive lines in a second direction by the insulating material, the second direction being perpendicular to the first direction and to the height; and a plurality of conductive segments having a length extending in the second direction and a height, each formed in the insulating material and separated from another of the plurality of conductive segments in the direction of the length of the conductive lines by the insulating material, each of the plurality of conductive segments electrically connected to each of the plurality of conductive lines, the heights of the plurality of conductive lines being greater than the heights of the plurality of conductive segments.

5. The inductive element of claim 4, wherein each of the plurality of conductive lines has a top surface, the top surfaces of the plurality of conductive lines being coplanar with one another.

6. The inductive element of claim 5, wherein each of the plurality of conductive segments has a top surface, the top surfaces of the plurality of conductive lines being coplanar with one another.

7. The inductive element of claim 6, wherein the top surfaces of the plurality of conductive lines are coplanar with the top surfaces of the plurality of conductive segments.

8. The inductive element of claim 4, wherein the current has a maximum operating frequency, further wherein each of the plurality of conductive lines has a width extending in the second direction, the width of each of the plurality of conductive lines being equal to twice the skin thickness at the maximum operating frequency.

9. The inductive element of claim 4, wherein the insulating material is comprised of a plurality of insulating layers and each of the plurality of conductive lines is disposed in at least a portion of each of the plurality of insulating layers.

10. The inductive element of claim 9, wherein each of the plurality of conductive segments is disposed in only one of the plurality of insulating layers.

11. An inductive element for conducting current in a first direction, comprising:
   a plurality of conductive lines, each having a length extending in the first direction and having a height perpendicular to the first direction, the plurality of conductive lines formed in an insulating material such that each of the plurality of conductive lines is separated from another of the plurality of conductive lines in a second direction by the insulating material, the second direction being perpendicular to the first direction and to the height; and
   a plurality of conductive segments having a length extending in the second direction, each formed in the insulating material and separated from another of the plurality of conductive segments in the direction of the length of the conductive lines by the insulating material, each of the plurality of conductive segments electrically connected to each of the plurality of conductive lines, the conductive segments being the only electrical connection between any two of the plurality of conductive lines.

12. The inductive element of claim 11, wherein each of the plurality of conductive lines has a top surface, the top surfaces of the plurality of conductive lines being coplanar with one another.

13. The inductive element of claim 12, wherein each of the plurality of conductive segments has a top surface, the top surfaces of the plurality of conductive lines being coplanar with one another.

14. The inductive element of claim 13, wherein the top surfaces of the plurality of conductive, lines are coplanar with the top surfaces of the plurality of conductive segments.

15. The inductive element of claim 11, wherein the current has a maximum operating frequency, further wherein each of the plurality of conductive lines has a width extending in the second direction, the width of each of the plurality of conductive lines being equal to twice the skin thickness at the maximum operating frequency.

16. The inductive element of claim 11, wherein the insulating material is comprised of a plurality of insulating layers and each of the plurality of conductive lines is disposed in at least a portion of each of the plurality of insulating layers.

17. The inductive element of claim 16, wherein each of the plurality of conductive segments is disposed in only one of the plurality of insulating layers.

18. The inductive element of claim 16, wherein the each of the conductive segments has a width in the direction of the length of the conductive lines, the width being the minimum necessary to maintain homogeneous potentials along the lengths of each of the plurality of conductive lines.

* * * * *

UNITED STATES PATENT AND TRADEMARK OFFICE
CERTIFICATE OF CORRECTION

PATENT NO. : 6,617,665 B2
DATED : September 9, 2003
INVENTOR(S) : Alexis Farcy, Vincent Arnal and Joaquim Torres It is certified that error appears in the above-identified patent and that said Letters Patent is hereby corrected as shown below:

<u>Column 4,</u>
Line 28, should read as shown below:
-- illustrated in Figs. 2B and 3, are separate and parallel. Per- --

Signed and Sealed this

Sixteenth Day of December, 2003

JAMES E. ROGAN
*Director of the United States Patent and Trademark Office*